(12) United States Patent
Mariani et al.

(10) Patent No.: US 11,636,882 B2
(45) Date of Patent: Apr. 25, 2023

(54) INTEGRATED ASSEMBLIES HAVING SHIELD LINES BETWEEN NEIGHBORING TRANSISTOR ACTIVE REGIONS

(71) Applicant: Micron Technology, Inc., Boise, ID (US)

(72) Inventors: Marcello Mariani, Milan (IT); Antonino Rigano, Cernusco sul Naviglio (IT)

(73) Assignee: Micron Technology, Inc., Boise, ID (US)

( * ) Notice: Subject to any disclaimer, the term of this patent is extended or adjusted under 35 U.S.C. 154(b) by 395 days.

(21) Appl. No.: 16/667,289

(22) Filed: Oct. 29, 2019

(65) Prior Publication Data
US 2021/0125642 A1 Apr. 29, 2021

(51) Int. Cl.
*G11C 5/00* (2006.01)
*H01L 27/108* (2006.01)
*G11C 5/06* (2006.01)
*G11C 5/02* (2006.01)

(52) U.S. Cl.
CPC .............. *G11C 5/005* (2013.01); *G11C 5/025* (2013.01); *G11C 5/063* (2013.01); *H01L 27/10814* (2013.01)

(58) Field of Classification Search
CPC ......... G11C 5/005; G11C 5/025; G11C 5/063; G11C 7/02; H01L 27/10814; H01L 27/10876; H01L 27/10885
See application file for complete search history.

(56) References Cited

U.S. PATENT DOCUMENTS

| 8,368,137 | B2 | 2/2013 | Mokhlesi et al. |
| 9,773,728 | B1 * | 9/2017 | Juengling ............. H01L 23/528 |
| 9,773,888 | B2 | 9/2017 | Pulugurtha et al. |
| 2003/0072172 | A1 | 4/2003 | Somasekhar et al. |
| 2009/0003025 | A1 | 1/2009 | Mokhlesi et al. |
| 2011/0303974 | A1 | 12/2011 | Kim et al. |
| 2012/0106281 | A1 | 5/2012 | Kim et al. |
| 2013/0320433 | A1 | 12/2013 | Cho et al. |
| 2018/0182762 | A1 | 6/2018 | Juengling |

(Continued)

FOREIGN PATENT DOCUMENTS

| EP | 20881766 | 11/2022 | |
| JP | 2004040042 A * | 2/2004 | ............... G11C 7/18 |

(Continued)

*Primary Examiner* — Shahed Ahmed
*Assistant Examiner* — Sun Mi Kim King
(74) *Attorney, Agent, or Firm* — Wells St. John P.S.

(57) ABSTRACT

Some embodiments include an integrated assembly having digit lines supported by a base and extending along a first direction. A shield-connection-line is supported by the base and extends along the first direction. Transistor active regions are over the digit lines. Each of the active regions includes a channel region between an upper source/drain region and a lower source/drain region. The lower source/drain regions are coupled with the digit lines. Capacitors are coupled with the upper source/drain regions. Wordlines extend along a second direction which crosses the first direction. The wordlines include gate regions adjacent the channel regions. Shield lines extend along the second direction. The shield lines are above the digit lines and are coupled with the shield-connection-line.

35 Claims, 14 Drawing Sheets

(56) References Cited

U.S. PATENT DOCUMENTS

2018/0331029 A1\* 11/2018 Sukekawa ........... H01L 23/5225
2019/0295941 A1   9/2019 Ramaswamy

FOREIGN PATENT DOCUMENTS

| KR | 10-2004-0059014 | 7/2004 |
| TW | 109137376 | 7/2021 |
| WO | WO PCT/US2020/056173 | 2/2021 |
| WO | WO PCT/US2020/056173 | 5/2022 |

\* cited by examiner

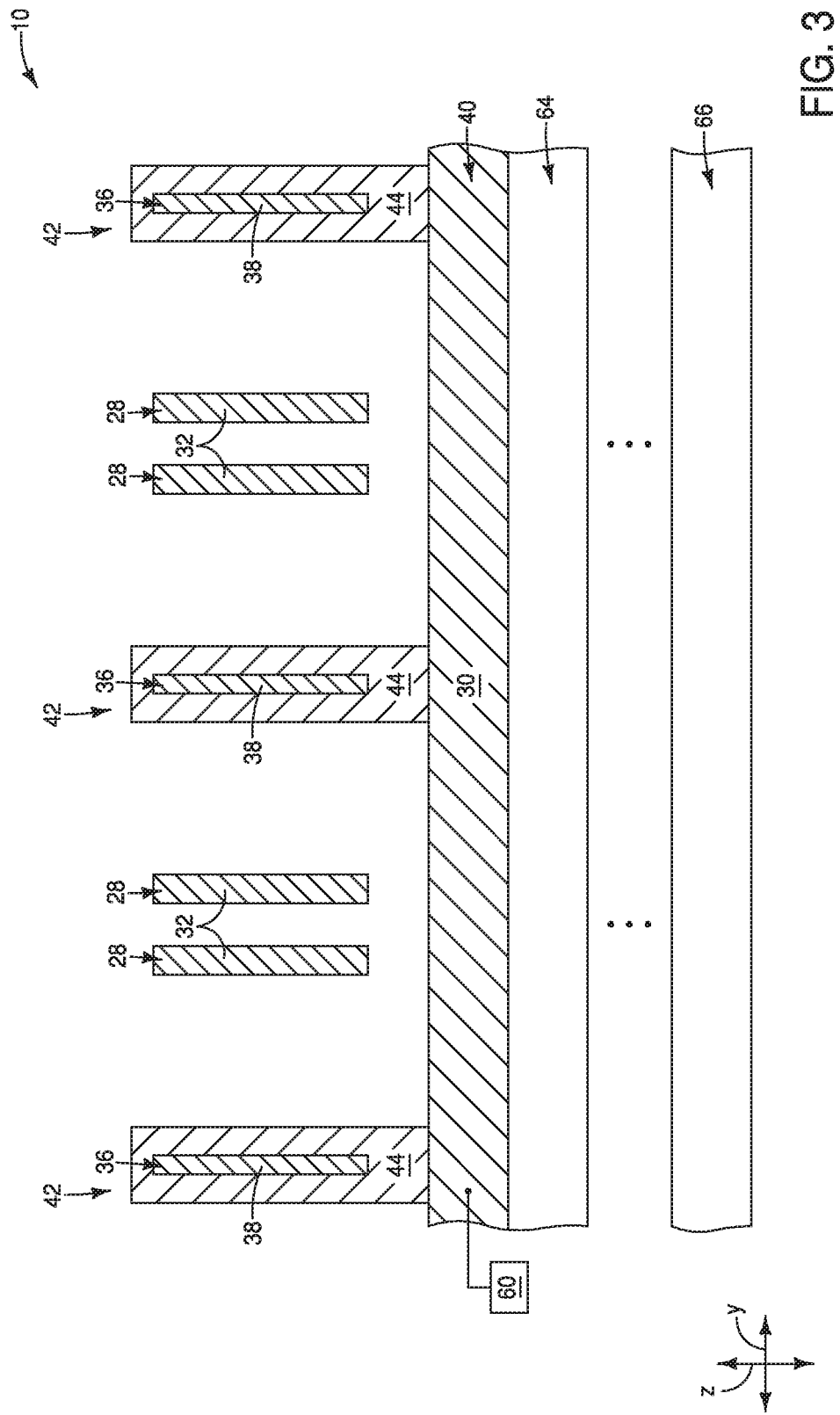

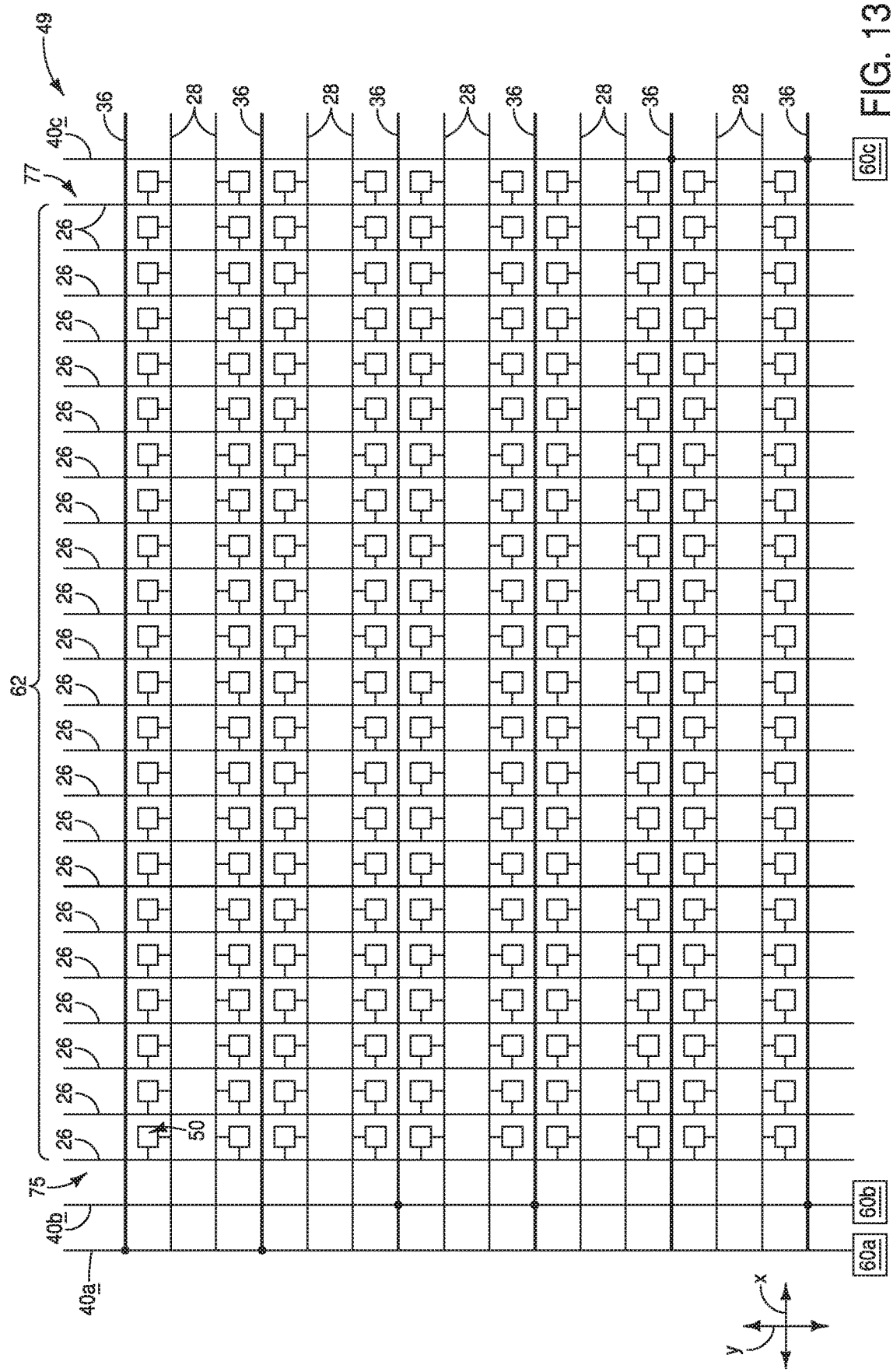

INTEGRATED ASSEMBLIES HAVING SHIELD LINES BETWEEN NEIGHBORING TRANSISTOR ACTIVE REGIONS

TECHNICAL FIELD

Integrated assemblies. Integrated assemblies having shield lines between neighboring transistor active regions.

BACKGROUND

Memory is one type of integrated circuitry, and is used in computer systems for storing data. An example memory is DRAM (dynamic random-access memory). DRAM cells may each comprise a transistor in combination with a capacitor. The DRAM cells may be arranged in an array; with wordlines extending along rows of the array, and with digit lines extending along columns of the array. The wordlines may be coupled with the transistors of the memory cells. Each memory cell may be uniquely addressed through a combination of one of the wordlines with one of the digit lines.

A problem which may be encountered in conventional memory architectures is that crosstalk (disturbance) may occur between adjacent memory cells, leading to loss of data. The crosstalk becomes increasing problematic as memory architectures are scaled to increasing levels of integration. It would be desirable to alleviate or prevent such undesired crosstalk.

BRIEF DESCRIPTION OF THE DRAWINGS

FIG. 3 is a diagrammatic cross-sectional side view along the line 3-3 of FIG. 1.

FIGS. 8-13 are diagrammatic schematic views of example memory devices.

DETAILED DESCRIPTION OF THE ILLUSTRATED EMBODIMENTS

Figure 1:
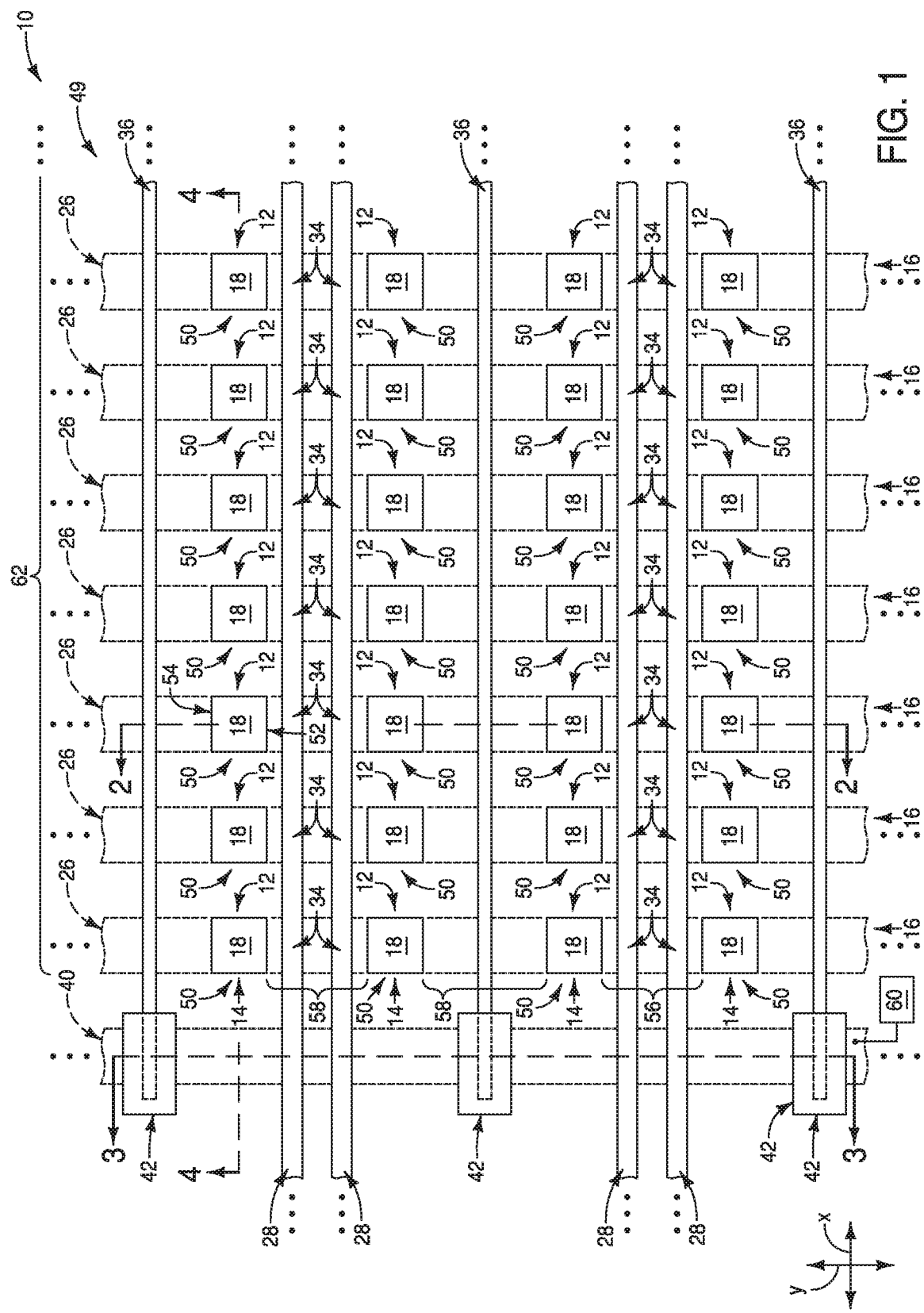
FIG. 1 is a diagrammatic top-down view a region of an example integrated assembly.

Some embodiments include memory devices having transistor-active-region-pillars distributed in a matrix comprising rows and columns. Digit lines are under the transistor-active-region-pillars and extend along the columns. At least one shield-connection-line extends parallel to the digit lines and is laterally offset from the digit lines. Wordlines are over the digit lines and said at least one shield-connection-line, and extend along the rows. Shield lines are over the digit lines and extend along the same direction as the wordlines. The shield lines are coupled with said at least one shield-connection-line. Each of the transistor-active-region-pillars has one side adjacent a wordline, and has an opposing side adjacent a shield line. Example embodiments are described with reference to FIGS. 1-13.

Referring to FIGS. 1-4, an example integrated assembly (construction, architecture) 10 includes pillars 12 arranged in a matrix. The matrix includes rows 14 and columns 16. The rows extend along an illustrated x-axis direction, and the columns extend along an illustrated y-axis direction. The pillars 12 extend vertically along an illustrated z-axis direction.

The vertically-extending pillars 12 comprise semiconductor material 18. The semiconductor material 18 may comprise any suitable composition(s); and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). In some embodiments, the semiconductor material 18 may comprise, consist essentially of, or consist of silicon.

Each of the semiconductor pillars 12 comprises a conductively-doped lower source/drain region 20, a conductively-doped upper source/drain region 22, and a channel region 24 between the source/drain regions 20 and 22. Dashed lines 21 are provided to diagrammatically illustrate approximate boundaries between the lower source/drain regions 20 and the channel regions 24, and dashed lines 23 are provided to illustrate approximate boundaries between the upper source/drain regions 22 and the channel regions 24.

The source/drain regions 20 and 22 may be doped with any suitable dopant to any suitable concentration. For instance, the source/drain regions 20 and 22 may be n-type doped regions which are doped with one or both of arsenic and phosphorus to a dopant concentration of at least about $10^{22}$ atoms/cm$^3$. Alternatively, the source/drain regions 20 and 22 may be p-type doped regions which are doped with, for example, boron.

The channel regions 24 may comprise a suitable concentration of one or more suitable dopants to achieve a desired threshold voltage. The dopants may include one or more of boron, phosphorus, arsenic, etc., and the dopant concentration may be less than or equal to about $10^{18}$ atoms/cm$^3$.

The regions 20, 22 and 24 may be transistor active regions, and the pillars 12 may be considered to correspond to transistor-active-region-pillars.

Digit lines (also referred to as bitlines or sense lines) 26 are under the pillars 12 and extend along the y-axis direction. The digit lines are shown in dashed-line view (phantom view) in FIG. 1 to indicate that they are under other materials.

Wordlines (also referred to as access lines) 28 are adjacent the pillars 12 and extend along the x-axis direction.

In some embodiments, one of the x-axis and y-axis directions may be referred to as a first direction, and the other may be referred to as a second direction. Accordingly, either the wordlines or the digit lines may be considered to extend along a first direction, and the other of the wordlines or the digit lines may be considered to extend along a second direction which crosses the first direction. In the illustrated embodiment, the second direction is orthogonal to the first direction (i.e., the x-axis and y-axis directions are orthogonal to one another). In other embodiments, the wordlines may extend along a direction which crosses the direction of the digit lines, but which is not orthogonal to the direction of the digit lines.

The digit lines 26 comprise conductive digit line material 30, and the wordlines 28 comprise conductive wordline material 32. The materials 30 and 32 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). The materials 30 and 32 may comprise a same composition as one another, or may comprise different compositions relative to one another. In some example embodiments, the materials 30 and 32 comprise one or more metals (e.g., comprise one or more of titanium, tungsten, titanium silicide, titanium nitride, tungsten silicide, tungsten nitride, etc.); and accordingly may be referred to as metal-containing materials.

The wordlines 28 comprise gate regions 34 adjacent the channel regions 24. In operation, sufficient voltage applied to the gate regions 34 will induce an electric field within associated channel regions 24 which enables current flow through the channel regions to thereby electrically couple the associated source/drain regions 20 and 22 to one another. If the voltage to a gate region is below a threshold level, the current will not flow through the associated channel region, and the associated source/drain regions will not be electrically coupled with one another. The selective control of the coupling/decoupling of the source/drain regions through the level of voltage applied to the gate regions may be referred to as gated coupling of the source/drain regions. The gate regions 34 may be considered to be operatively proximate the associated channel regions 24, with the term "operatively proximate" meaning that the gate regions are within appropriate proximity of the associated channel regions to induce appropriate electric fields within the associated channel regions to achieve gated coupling of the associated source/drain regions.

Shield lines 36 extend through the matrix of the pillars 12, with the shield lines extending along the x-axis direction and being above the digit lines 26. The shield lines 36 comprise conductive material 38. The conductive material 38 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the conductive material 38 may be a metal-containing material.

A shield-connection-line 40 is adjacent the matrix of the pillars 12, and is electrically coupled with the shield lines 36. The shield-connection-line 40 is shown in dashed-line (phantom) view in FIG. 1 to indicate that it is under other materials.

Figure 4:
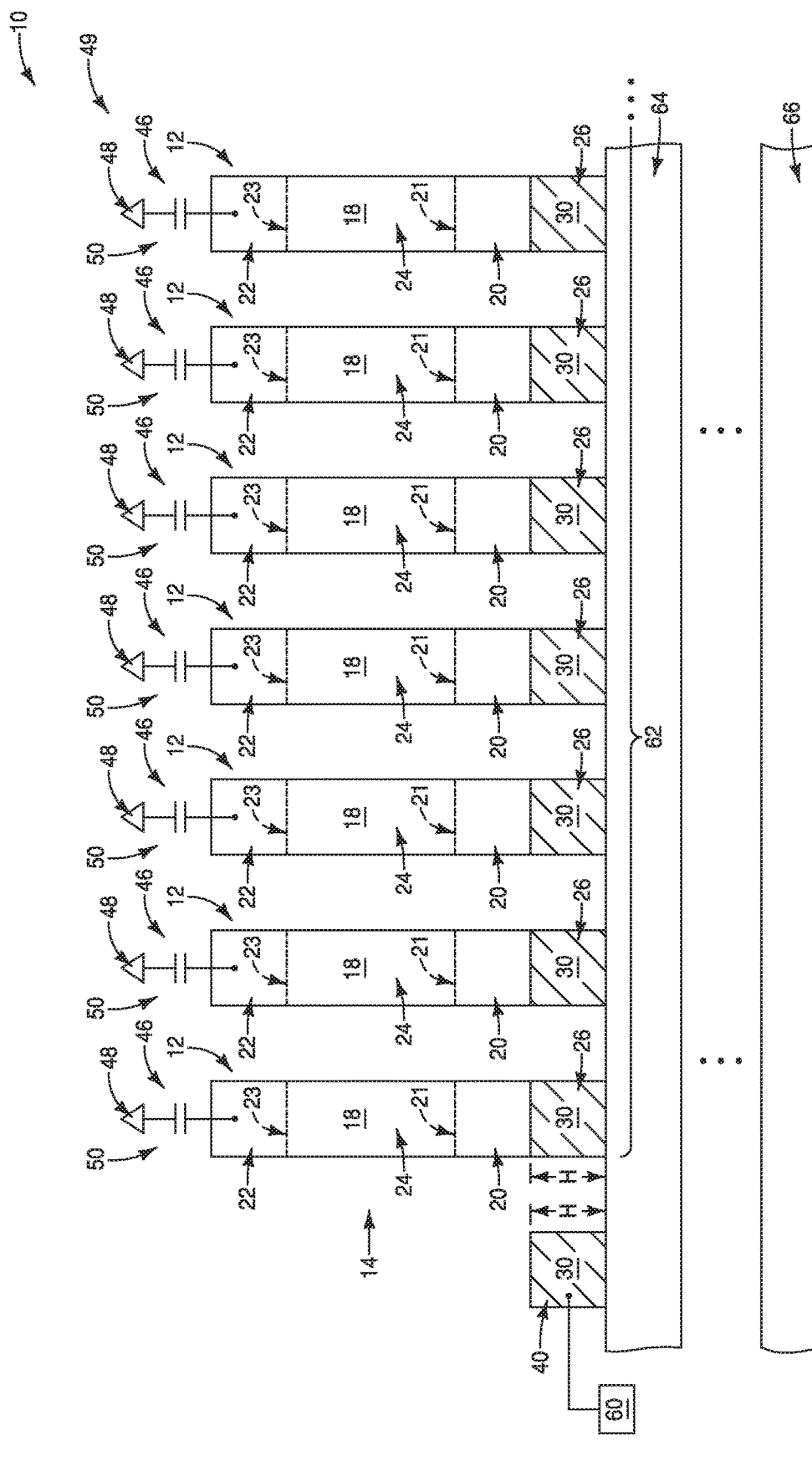
FIG. 4 is a diagrammatic cross-sectional side view along the line 4-4 of FIG. 1.

The shield-connection-line comprises the same conductive material 30 as the digit lines 26. In some embodiments, the shield-connection-line 40 may be patterned from a same conductive expanse as the digit lines 26 (as discussed below with reference to FIGS. 5-7). In the illustrated embodiment, the shield-connection-line 40 comprises a same height, H, as the digit lines 26 (as shown in FIG. 4).

In some embodiments, the digit lines 26 and the shield-connection-line 40 may all be considered to be conductive lines which extend along the direction of the y-axis, and which all comprise a common composition as one another and a common height as one another.

The shield lines 36 are electrically coupled with the shield-connection-line 40 at interconnect regions 42. In the illustrated embodiment, such interconnect regions comprise a conductive material 44 which extends from the shield-connection-line 40 to the shield lines 36. The conductive material 44 may comprise any suitable electrically conductive composition(s); such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The semiconductor pillars 12 may be incorporated into a memory array (e.g., a DRAM array) 49. The lower source/drain regions 20 of the semiconductor pillars are electrically coupled with the digit lines 26 (and in the shown embodiment are directly against the digit lines 26), and the upper source/drain regions 22 of the pillars may be electrically coupled with storage elements 46. The storage elements 46 are only shown along the cross-sectional side views of FIGS. 2 and 4, and are not shown along the top-down view of FIG. 1 in order to simplify FIG. 1.

The storage elements 46 may be any suitable devices having at least two detectable states; and in some embodiments may be, for example, capacitors, resistive-memory devices, conductive-bridging devices, phase-change-memory (PCM) devices, programmable metallization cells (PMCs), etc. In the illustrated example embodiment, the storage elements 46 are capacitors. Each of the capacitors has one node coupled with an upper source/drain region 22 of an associated semiconductor pillar 12, and has another node coupled with a reference source 48. The reference source 48 may be at any suitable voltage; such as, for example, ground, VCC/2, etc.

Each of the storage elements 46 may be considered to be comprised by a memory cell 50 of the memory array 49. The columns of the memory array are along the columns 16 and comprise the semiconductor pillars 12 coupled with a common digit line 26 (i.e., associated with the common digit line). The rows of the memory array are along the rows 14 and comprise the pillars 12 having channel regions operatively proximate gate regions along a common wordline 28 (i.e., associated with the common wordline). Each of the memory cells 50 is uniquely addressed by one of the digit lines 16 in combination with one of the wordlines 14. The gate regions 34, together with the transistor active regions of pillars 12, may be considered to correspond to access devices (access transistors) associated with the individual memory cells.

As discussed in the Background section, a problem which may be encountered in conventional memory architectures is undesired crosstalk between neighboring devices (e.g., transistor active regions). The embodiment of FIGS. 1-4 advantageously provides the shield lines 36 between memory cells 50 that are neighboring to one another along the columns 16. Such may alleviate, or even prevent, undesired crosstalk between such memory cells; and accordingly may be a substantial improvement relative to conventional configurations.

Figure 2:
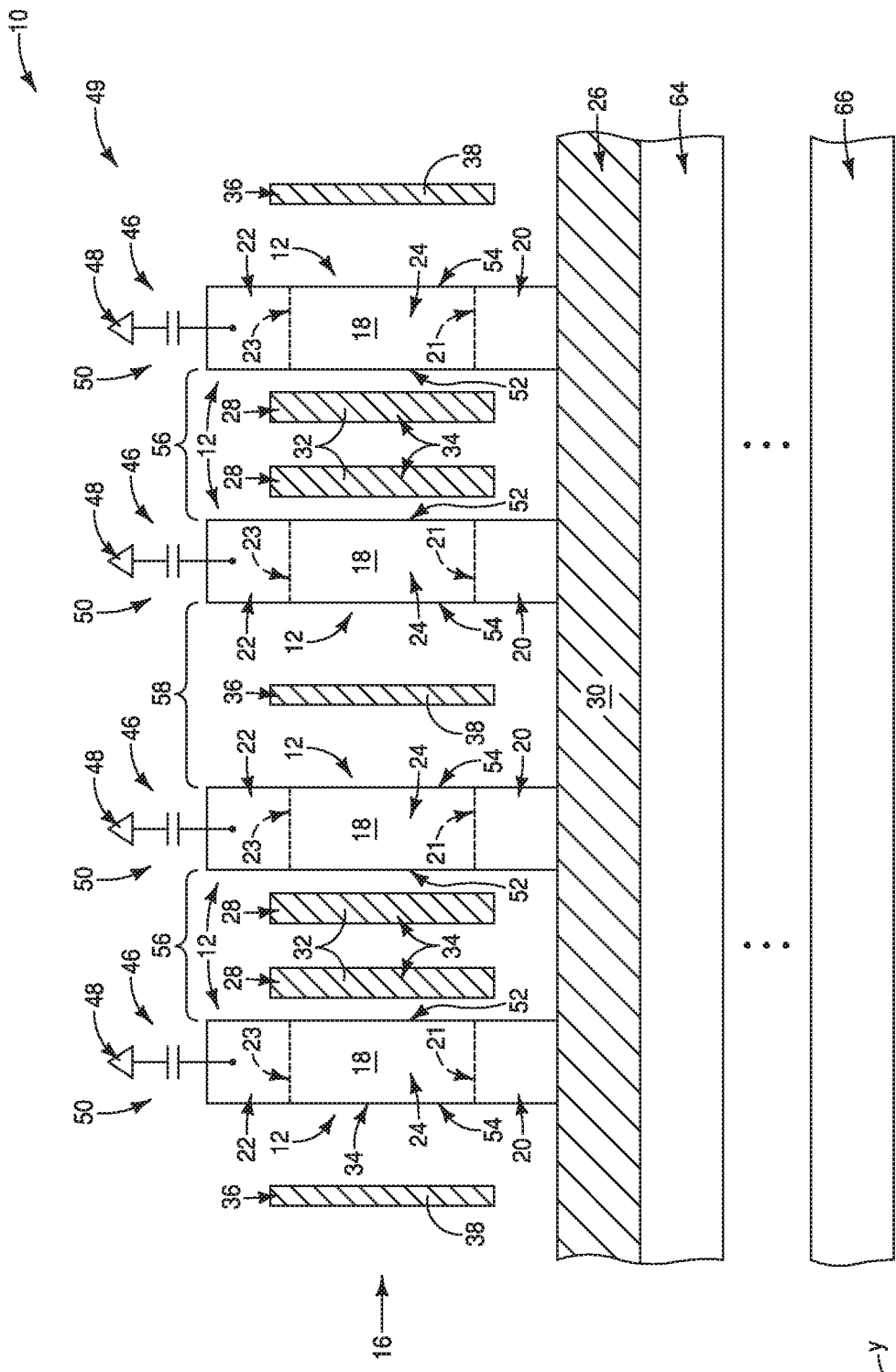
FIG. 2 is a diagrammatic cross-sectional side view along the line 2-2 of FIG. 1.

In some embodiments, each of the pillars 12 may be considered to have a first side 52 and an opposing second side 54 (shown relative to one of the pillars 12 in the top-down view of FIG. 1, and in the cross-sectional side view of FIG. 2). The first side 52 is proximate an associated one of the wordlines 28, and the second side 54 is proximate an associated one of the shield lines 36.

In some embodiments, the semiconductor pillars 12 along a common column 16 may be considered to be spaced from one another by alternating first and second gaps 56 and 58 along the y-axis direction (with the gaps 56 and 58 being labeled in FIG. 2). Two of the wordlines 28 are within each of the first gaps 56, and one of the shield lines 36 is within each of the second gaps 58.

In some embodiments, the shield-connection-line 40 may be coupled with a reference-voltage-source 60. Such reference-voltage-source may be at any suitable voltage; including, for example, ground, VCC/2, etc. The reference-voltage-source may be passive (i.e., maintained at a static voltage during operation of the memory array 49) or may be active (e.g., modulated between one or more different voltages during operation of the memory array 49).

In some embodiments, the digit lines 26 may be considered together to be a group 62, and the shield-connection-line 40 may be considered to be outward of such group, and along one side of the group.

Although the embodiment of FIGS. 1-4 shows a single shield-connection-line, in other embodiments (described below with reference to FIGS. 10-13) there may be two or more of the shield-connection-lines.

The shield-connection-line 40 and the digit lines 26 are supported by an underlying insulative base 64. Such base may comprise any suitable composition(s); and may, for example, comprise, consist essentially of, or consist of one or more of silicon nitride, silicon dioxide, aluminum oxide, etc.

The base 64 is shown to be supported by a semiconductor substrate 66. The substrate 66 may comprise semiconductor material; and may, for example, comprise, consist essentially of, or consist of monocrystalline silicon. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above.

A gap is provided between the substrate 66 and the base 64 to indicate that there may be other materials or devices provided between the substrate 66 and the base 64. For instance, in some embodiments the reference source 60 may be provided under the memory array 49 and between the substrate 66 and the base 64. Also, the wordlines 28 may be coupled with wordline drivers (not shown), and the digit lines 26 may be coupled with sense amplifiers (not shown); and the wordline drivers and/or the sense amplifiers may be provided under the memory array 49. In some embodiments, the wordline drivers, sense amplifiers and/or reference source may comprise CMOS circuitry (and/or other suitable logic circuitry) which is provided under the memory array 49.

Figure 2A:
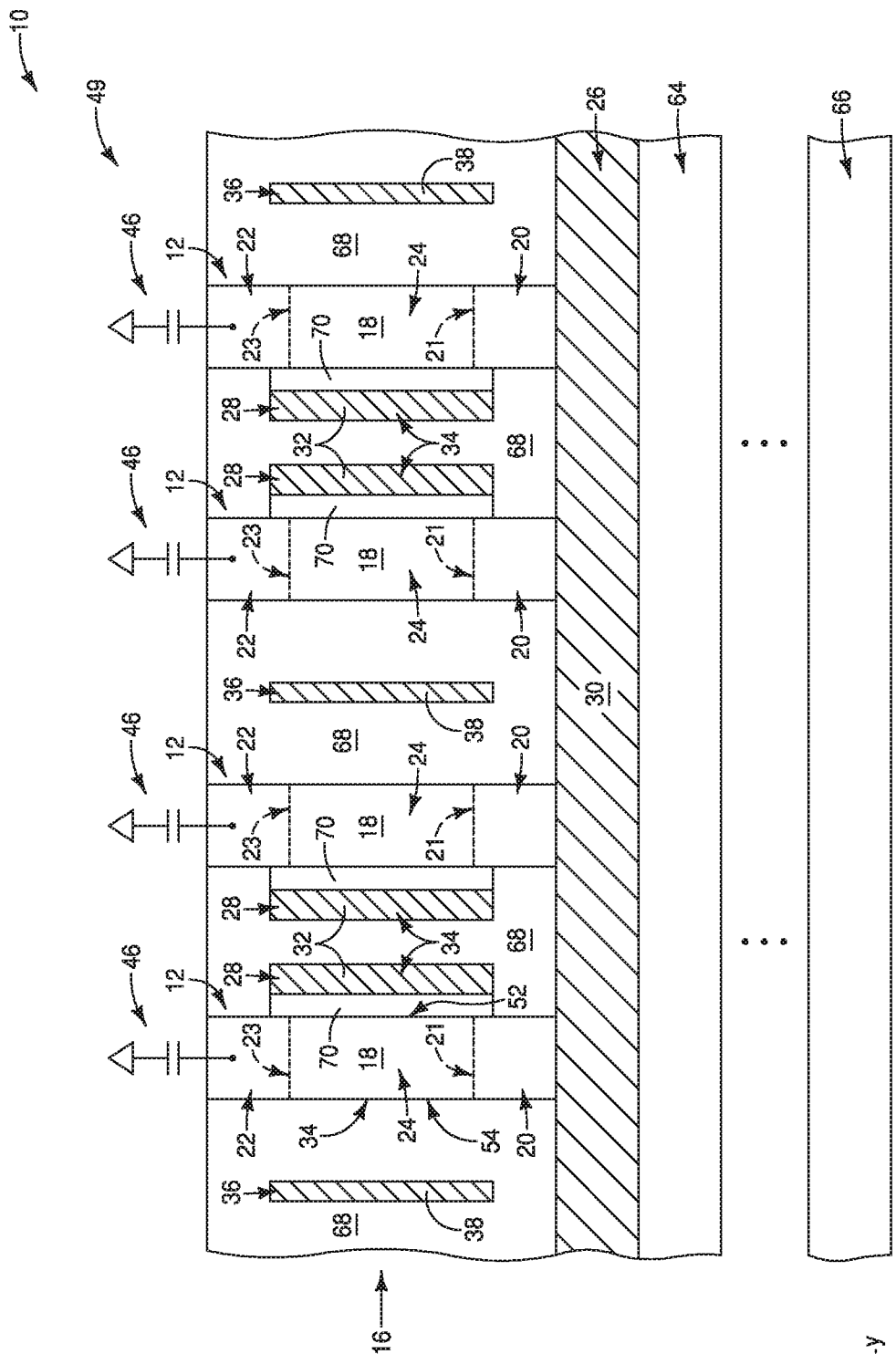
FIG. 2A is a diagrammatic cross-sectional side view similar to that of FIG. 2, and showing additional materials.

The illustrated arrangement of FIGS. 1-4 does not show insulative materials in order to simplify the drawings. However, it is to be understood that one or more insulative materials may be provided over and around the illustrated conductive structures. FIG. 2A shows the configuration of FIG. 2, and further shows example insulative materials 68 and 70.

The insulative material 70 corresponds to gate dielectric material provided between the gate regions 34 and the channel regions 24. Such gate dielectric material may comprise any suitable composition(s); and in some embodiments may comprise, consist essentially of, or consist of silicon dioxide.

The insulative material 68 provides support under the conductive structures 28 and 36, provides isolation between the structures 28 and 36, and provides a surface over the structures 28 and 36. The insulative material 68 may comprise any suitable composition(s); and in some embodiments may comprise, consist essentially of, or consist of one or more of silicon nitride, silicon dioxide, aluminum oxide, etc. Although the materials 68 and 70 are shown to be homogeneous, it is to be understood that in other embodiments one or both of the materials 68 and 70 may comprise discrete combinations of two or more different compositions. For instance, the insulative material provided under the wordlines 28 to support such wordlines may be different than the insulative material provided over and between the wordlines 28.

Figure 5:
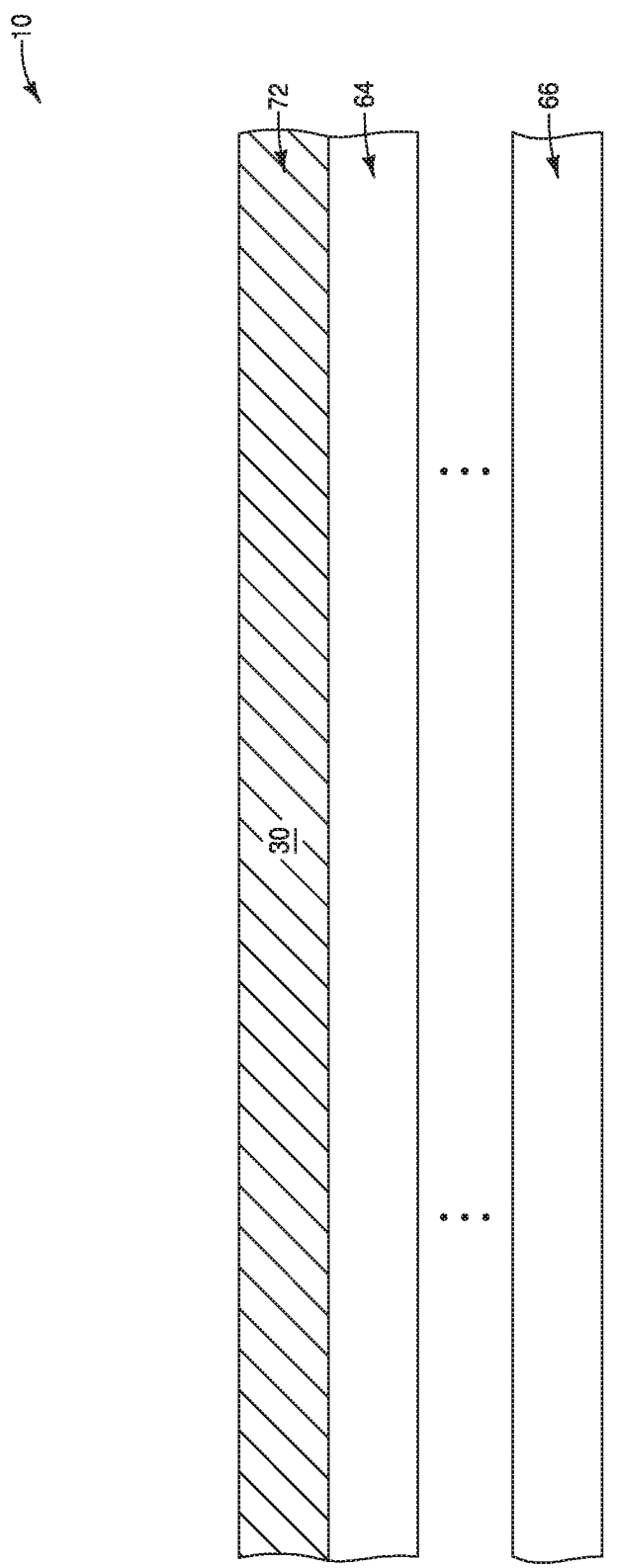
FIGS. 5-7 are diagrammatic cross-sectional side views of an example integrated assembly at example sequential process stages of an example method.

In some embodiments, the digit lines 26 and the shield-connection-line 40 may be patterned from a common conductive expanse. FIG. 5 shows the integrated assembly 10 at a process stage which may be utilized during formation of the digit lines 26 and the shield-connection-line 40, and shows the assembly along a same view as is utilized above for FIG. 4.

The assembly of FIG. 5 includes an expanse 72 of the conductive material 30 over the base 64.

Figure 6:
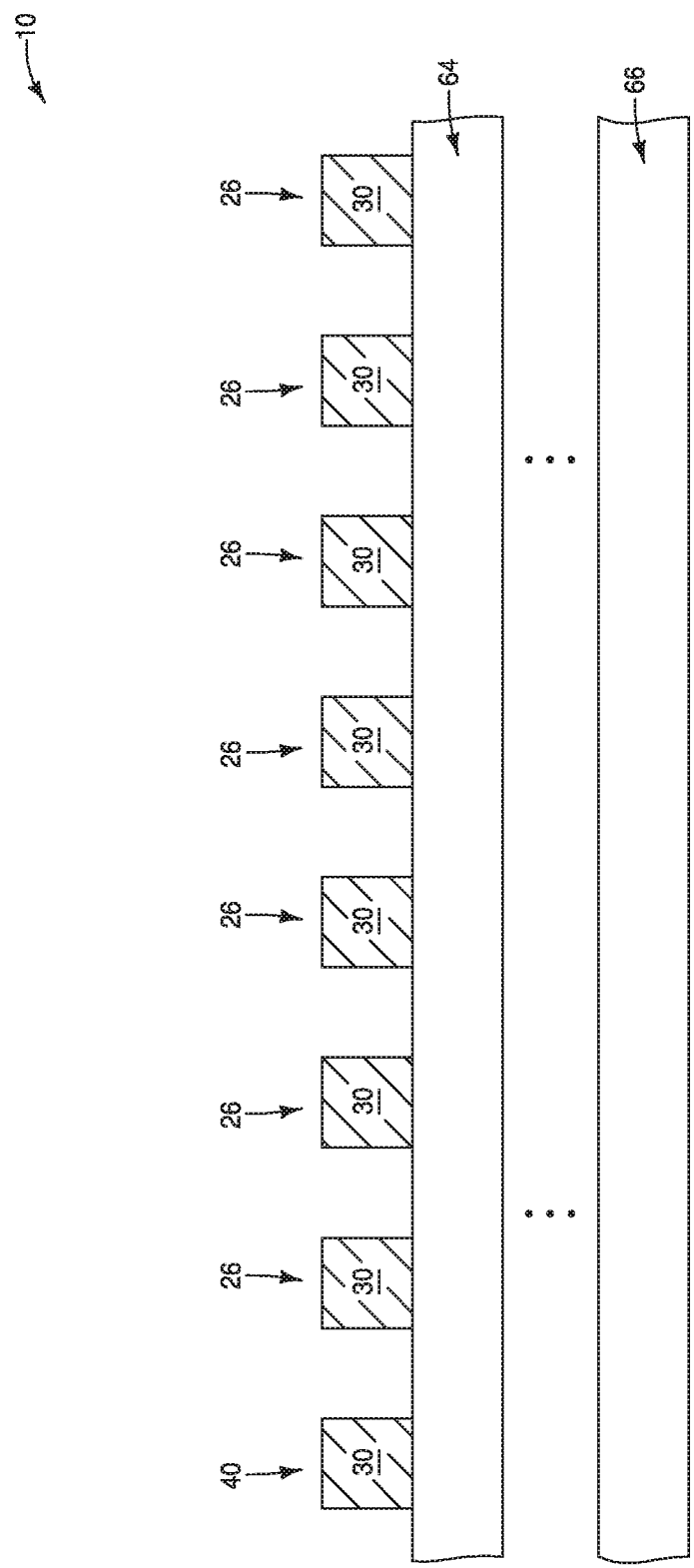

FIG. 6 shows a process stage which may follow that of FIG. 5, and shows the expanse 72 (FIG. 5) patterned into the digit lines 26 and the conductive-shield-line 40.

Figure 7:
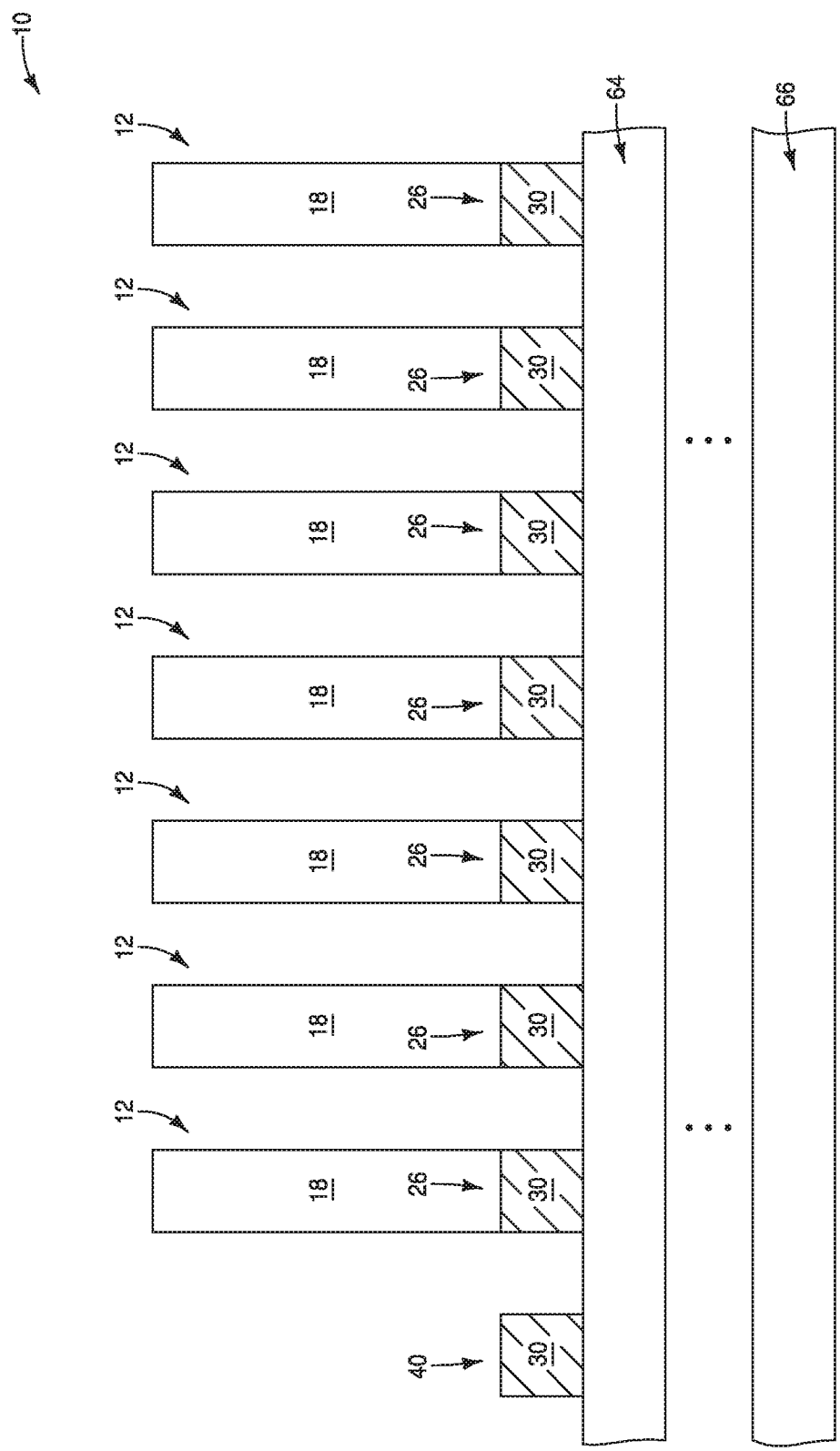

FIG. 7 shows a process stage which may follow that of FIG. 6, and shows the semiconductor material 18 provided over the digit lines 26 and patterned into the pillars 12. Although the semiconductor material 18 is shown provided after the patterning of the material 30 into the digit lines 26, it is to be understood that in other embodiments the semiconductor material may be provided over the expanse 72 of FIG. 5 and that at least some of the patterning of the semiconductor material may occur during the patterning of the digit lines 26.

Figure 8:
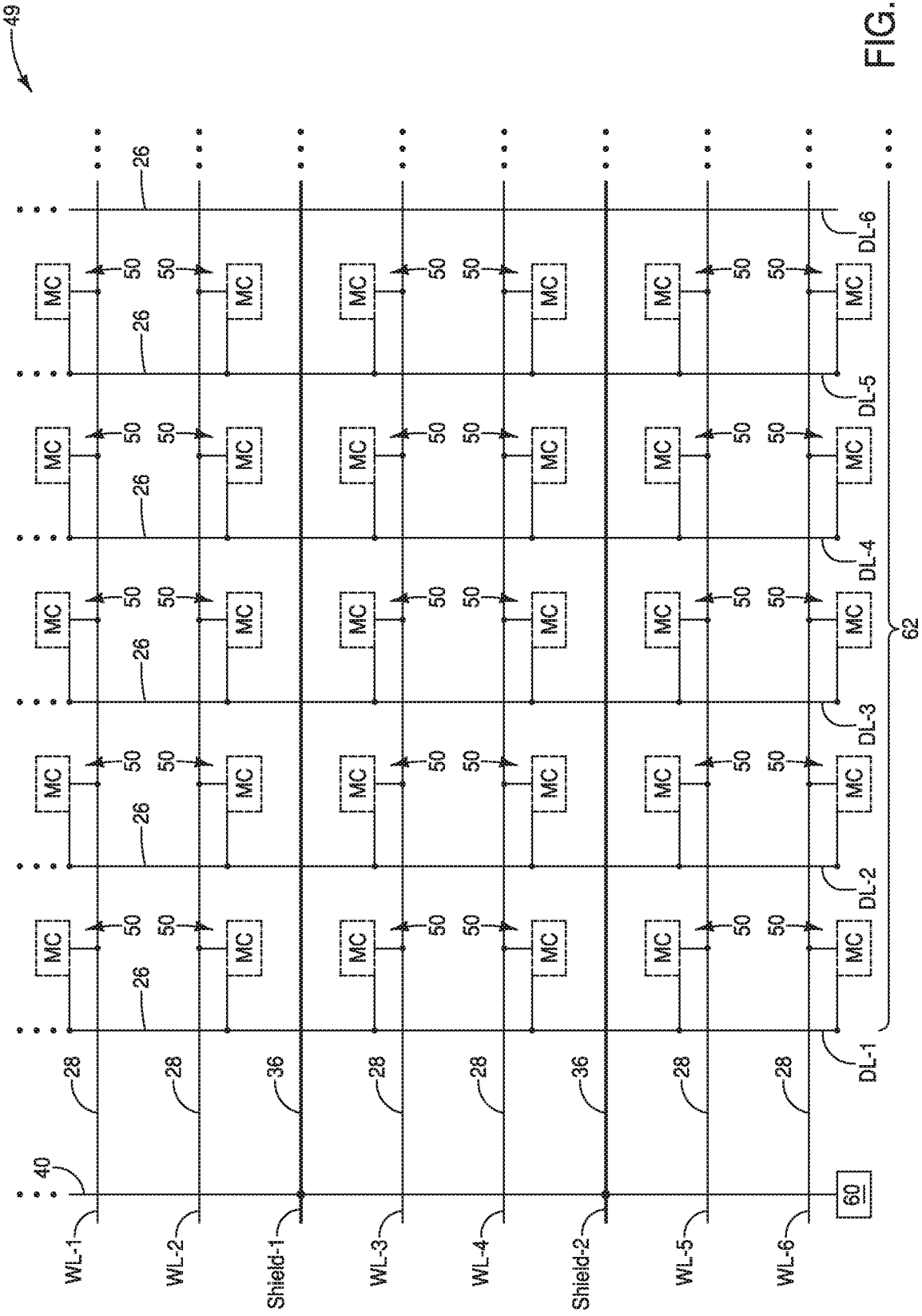
Figure 9:
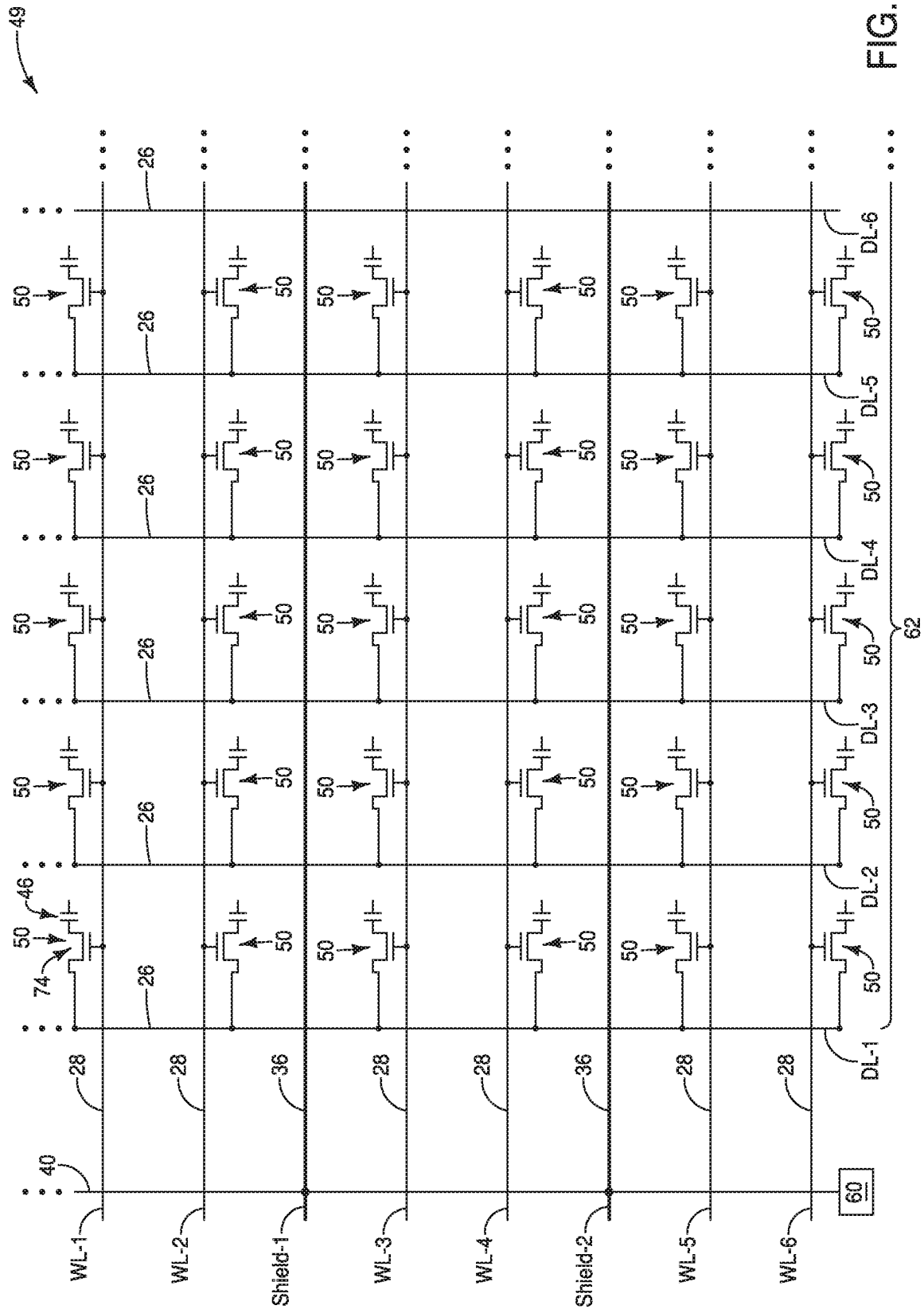

The memory array 49 of FIGS. 1-4 is schematically illustrated in FIGS. 8 and 9. Such figures show the illustrated wordlines 28 as wordlines WL-1, WL-2, WL-3, WL-4, WL-5 and WL-6, and show the illustrated digit lines 26 as digit lines DL-1, DL-2, DL-3, DL-4, DL-5 and DL-6. The digit lines 26 are within the group 62. The shield-connection-line 40 is along one side of such group, and is offset from the group. The shield-connection-line 40 is coupled with the reference-voltage-source 60, and is also coupled with the shield lines 36. The illustrated shield lines are shown as Shield-1 and Shield-2.

FIG. 8 shows the memory cells 50 generically as MC, with each memory cell being uniquely addressed by the combination of one of the wordlines 28 and one of the digit lines 26. FIG. 9 shows example memory cells 50 to comprise an access transistor 74 in combination with a capacitor 46. The access transistor 74 may comprise the active-region-pillars 12 and gate regions 34 described above with reference to FIGS. 1-4.

The memory array 49 may comprise any suitable number of memory cells 50, and in some embodiments may comprise hundreds, thousands, millions, etc., of the memory cells.

In some embodiments, multiple shield-connection-lines may be provided along a memory array. FIGS. 10-13 illustrate example embodiments utilizing two or more shield-connection-lines.

Figure 10:
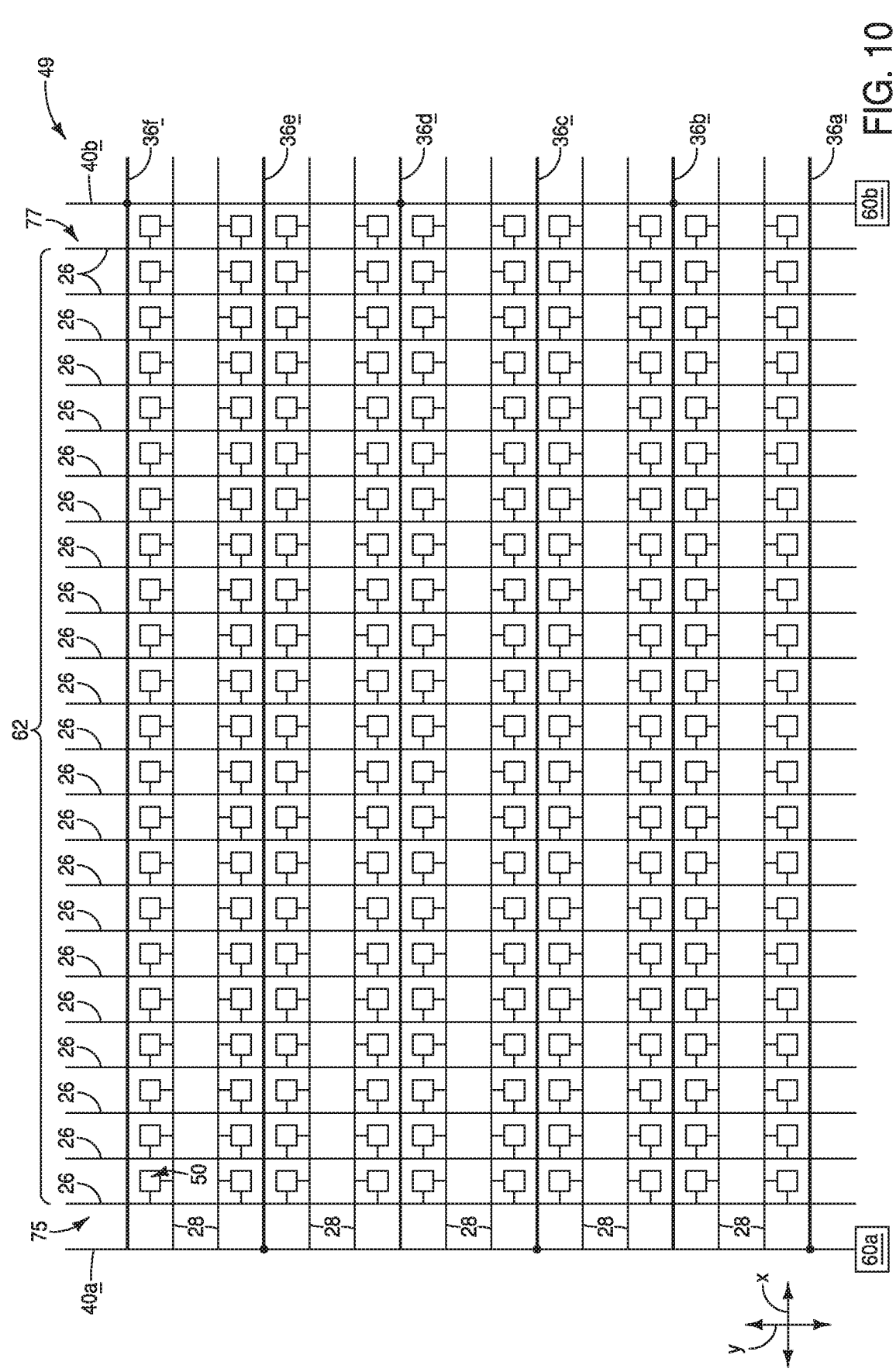

FIG. 10 shows the memory array 49 in a configuration having a first shield-connection-line 40a along a first side 75 of the group 62 of the digit lines 26, and a second shield-connection-line 40b along a second side 77 of the group 62 of the digit lines 26. The shield-connection lines 40a and 40b are shown to be electrically coupled with first and second reference-voltage-sources 60a and 60b, respectively. In some embodiments, the reference-voltage-sources 60a and 60b may be separate from one another, and may be operated differently relative to one another. In other embodiments, the reference-voltage-sources 60a and 60b may be part of the same (common) reference-voltage-source.

The shield lines 36 are sequentially labeled as 36a-36f so they may be distinguished relative to one another. The shield lines 36a, 36c and 36e are coupled with the first shield-connection-line 40a; and the shield lines 36b, 36d and 36f are coupled with the second shield-connection-line 40b. In some embodiments, the shield lines 36a, 36c and 36e may be considered to be a first set of the shield lines, and the shield lines 36b, 36d and 36f may be considered to be a second set of the shield lines. In the embodiment of FIG. 10, each of the shield lines 36 is coupled with only one of the shield-connection lines 40, and the connections to the shield-connection lines are distributed sequentially to the different shield-connection-lines along the y-axis direction (specifically, the connections to the shield-connection lines alternate between connections to the first shield-connection-line 40a and connections to the second shield-connection-line 40b along the direction of the y-axis).

In some embodiments, the digit lines 26 and the shield-connection-lines 40a and 40b may be together considered to be a group of conductive lines. The shield-connection-lines 40a and 40b may be considered to be edge lines of such group of conductive lines; with the shield-connection-line 40a being a first edge line along a first side of the group of the conductive lines, and the shield-connection-line 40b being a second edge line along a second side of the group of the conductive lines. The second side of the group of the conductive lines is in opposing relation relative to the first side of the group of the conductive lines.

Figure 11:
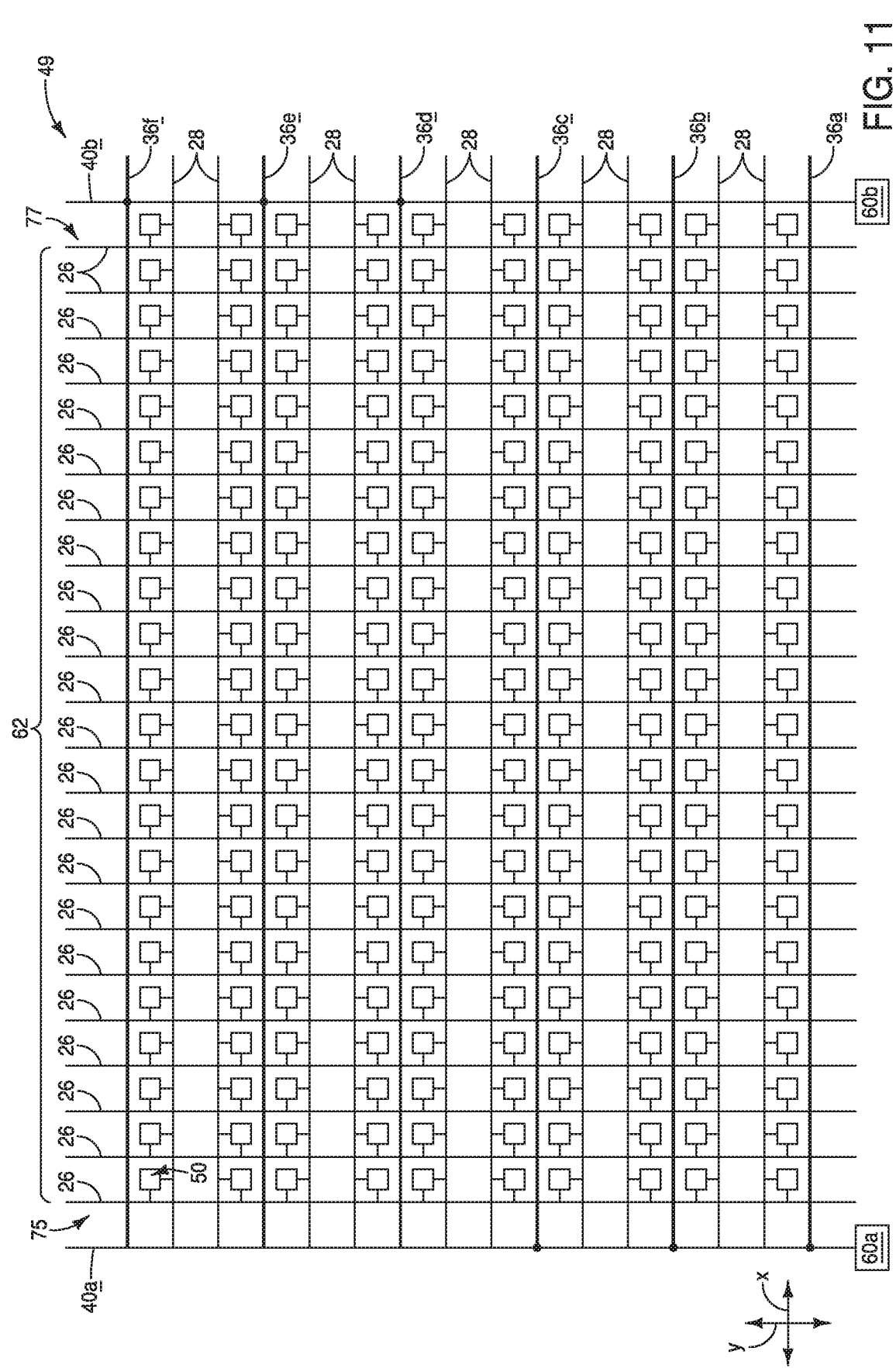

FIG. 11 shows the memory array 49 in an arrangement analogous to that of FIG. 10, but in which the connections to the shield-connection-lines 40a and 40b are distributed in batches along the y-axis direction. Specifically, the shield lines 36a, 36b and 36c correspond to a first batch of shield lines coupled with the shield-connection-line 40a, and the shield lines 36d, 36e and 36f correspond to a second batch of shield lines coupled with the second shield-connection-line 40b. Both of the shield-connection-lines 40a and 40b are outward of the group 62 of the digit lines 26, with the shield-connection-line 40a being along the first side 75 side of the group 62 of the digit lines 26 and the shield-connection-line 40b being along the opposing second side 77 of the group 62 of the digit lines 26.

The shield-connection-lines 40a and 40b are connected to the reference-voltage-sources 60a and 60b, respectively. Such reference-voltage-sources may be part of a common reference-voltage-source, or may be separate reference-voltage-sources operated independently of one another.

Figure 12:
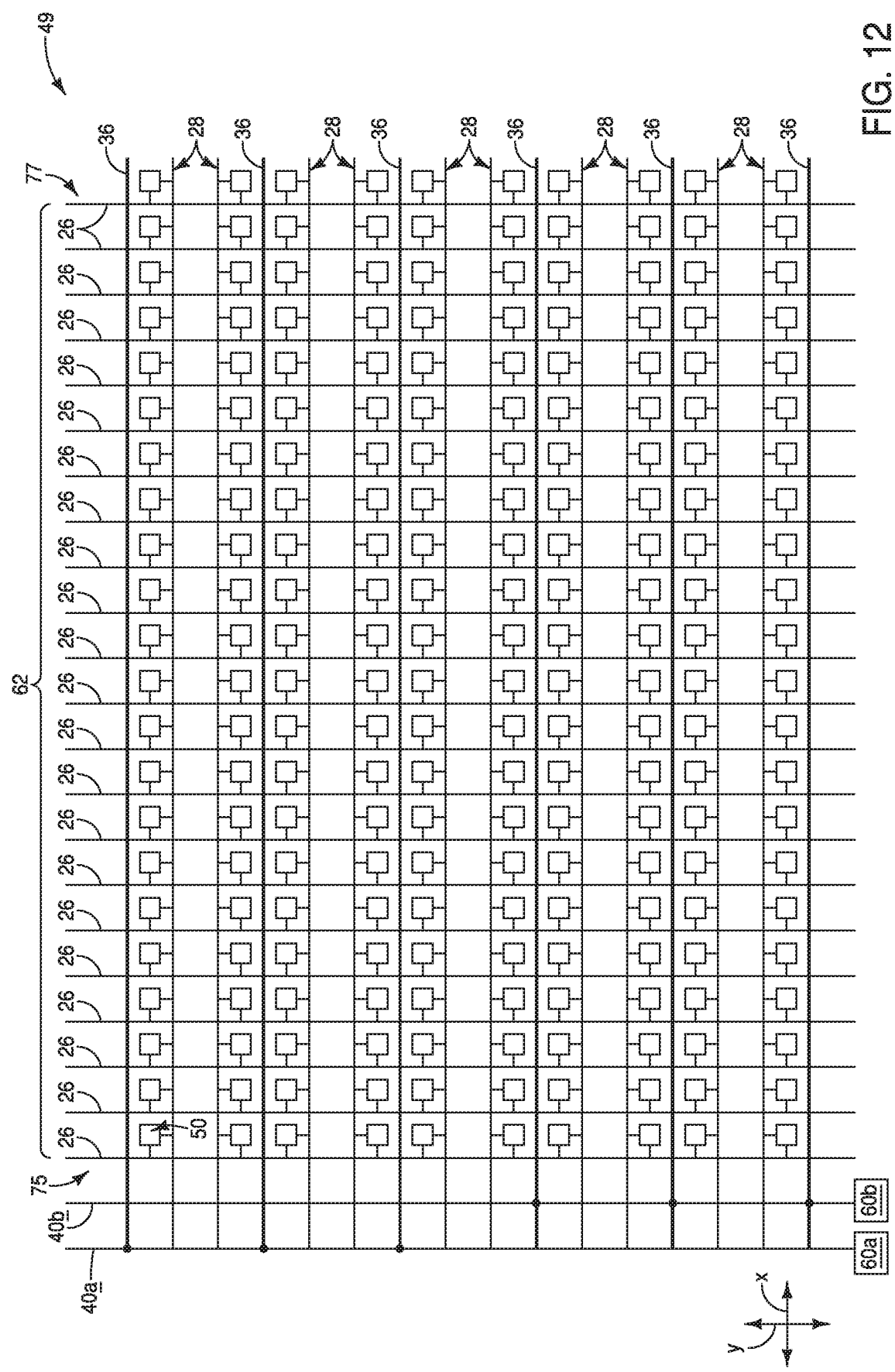

FIG. 12 shows the memory array 49 in an arrangement similar to that of FIG. 11, but in which both of the first and second shield-connection-lines are along the same side 75 of the group 62 of the digit lines 26.

FIG. 13 shows another embodiment of the memory 49, and shows three shield-connection-lines 40a, 40b and 40c outward of the group 62 of the digit lines 26. Two of the shield-connection lines are along the first side 75 of the group 62 of the digit lines 26 (specifically, the shield-connection-lines 40a and 40b), and the third of the shield-connection-lines is along the second side 77 of the group 62 of the digit lines 26 (specifically, the shield-connection-line 40c). In other embodiments, additional shield-connection-lines may be provided along one or both of the sites 75 and 77 of the group 62 of the digit lines 26, and/or one or more of the shield-connection-lines 40a, 40b and 40c may be omitted.

The shield-connection-lines 40a, 40b and 40c are shown coupled with reference-voltage-sources 60a, 60b and 60c. Such reference-voltage-sources may be part of a common reference-voltage-source, or at least two of the reference-voltage-sources may be separate reference-voltage-sources operated independently of one another.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The terms "electrically connected" and "electrically coupled" may both be utilized in this disclosure. The terms are considered synonymous. The utilization of one term in some instances and the other in other instances may be to provide language variation within this disclosure to simplify antecedent basis within the claims that follow.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present. The terms "directly under", "directly over", etc., do not indicate direct physical contact (unless expressly stated otherwise), but instead indicate upright alignment.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having conductive lines supported by a base and extending along a first direction. Some of the conductive lines are digit lines and at least one of the conductive lines is a shield-connection-line. Semiconductor pillars are over the digit lines. Each of the semiconductor pillars includes a channel region between an upper source/drain region and a lower source/drain region. The lower source/drain regions are coupled with the digit lines. Storage elements are coupled with the upper source/drain regions. Wordlines extend along a second direction which crosses the first direction. The wordlines include gate regions adjacent the channel regions. Shield lines extend along the second direction. Each of the shield lines is coupled with an associated one of the shield-connection-lines. Each of the semiconductor pillars has a first side proximate an associated one of the wordlines, and has a second side proximate an associated one of the shield lines.

Some embodiments include an integrated assembly having digit lines supported by a base and extending along a first direction. At least one shield-connection-line is supported by the base and extends along the first direction. Transistor active regions are over the digit lines. Each of the active regions includes a channel region between an upper source/drain region and a lower source/drain region. The lower source/drain regions are coupled with the digit lines. Capacitors are coupled with the upper source/drain regions. Wordlines extend along a second direction which crosses the first direction. The wordlines include gate regions adjacent the channel regions. Shield lines extend along the second direction. The shield lines are above the digit lines and are coupled with one or more of said at least one shield-connection-lines.

Some embodiments include an integrated assembly having conductive lines supported by a base and extending along a first direction. Some of the conductive lines are digit lines and one of the conductive lines is a shield-connection-line. The conductive lines all comprise a same material as one another and all comprise a same height as one another. Vertically-extending pillars are over the digit lines. Each of the vertically-extending pillars comprises a channel region between an upper source/drain region and a lower source/drain region. The lower source/drain regions are coupled with the digit lines. Storage elements are coupled with the upper source/drain regions. Wordlines extend along a second direction which crosses the first direction. The wordlines include gate regions adjacent the channel regions. Shield lines extend along the second direction. Each of the shield lines is coupled with the shield-connection-line.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
conductive lines supported by a base and extending along a first direction; some of the conductive lines being digit lines and at least one of the conductive lines being a shield-connection-line;
semiconductor pillars over the digit lines; each of the semiconductor pillars comprising a channel region between an upper source/drain region and a lower source/drain region; the lower source/drain regions being coupled with the digit lines;
storage elements coupled with the upper source/drain regions;
wordlines extending along a second direction which crosses the first direction, the wordlines having an elevationally uppermost surface at first elevation over the base and the pillars extending to a second elevation over the base that exceeds the first elevation; the wordlines including gate regions adjacent the channel regions;
shield lines extending along the second direction; each of the shield lines being coupled with an associated one of the shield-connection-lines; and
each of the semiconductor pillars having a first side proximate an associated one of the wordlines, and having a second side proximate an associated one of the shield lines.

2. The integrated assembly of claim 1 comprising only one of the shield-connection-lines.

3. An integrated assembly, comprising:
conductive lines supported by a base and extending along a first direction; some of the conductive lines being digit lines and at least two of the conductive lines being shield-connection-lines;
semiconductor pillars over the digit lines; each of the semiconductor pillars comprising a channel region between an upper source/drain region and a lower source/drain region; the lower source/drain regions being coupled with the digit lines;
storage elements coupled with the upper source/drain regions;
wordlines extending along a second direction which crosses the first direction; the wordlines including gate regions adjacent the channel regions;
shield lines extending along the second direction; each of the shield lines being coupled with an associated one of the shield-connection-lines; and
each of the semiconductor pillars having a first side proximate an associated one of the wordlines, and having a second side proximate an associated one of the shield lines.

4. The integrated assembly of claim 1 wherein:
the semiconductor pillars are arranged in a matrix comprising rows and columns;
the columns comprise the associated semiconductor pillars coupled with a common digit line;
the semiconductor pillars are spaced from one another by gaps along the first direction;
the gaps along a common column alternate between first gaps and second gaps;
two of the wordlines are within each of the first gaps; and
one of the shield lines is within each of the second gaps.

5. The integrated assembly of claim 1 wherein said at least one shield-connection-line is coupled with a reference-voltage-source.

6. The integrated assembly of claim 5 wherein the reference-voltage-source is at ground voltage.

7. The integrated assembly of claim 5 wherein the reference-voltage-source is not at ground voltage.

8. The integrated assembly of claim 1 wherein the storage elements are comprised by memory cells of a memory array; each of the memory cells being uniquely addressed with one of the digit lines in combination with one of the wordlines.

9. The integrated assembly of claim 8 wherein the memory array comprises DRAM.

10. An integrated assembly, comprising:
conductive lines supported by a base and extending along a first direction; some of the conductive lines being digit lines and one of the conductive lines being a shield-connection-line; the conductive lines all comprising a same material as one another and all comprising a same height as one another;
vertically-extending pillars over the digit lines; each of the vertically-extending pillars comprising a channel region between an upper source/drain region and a lower source/drain region; the lower source/drain regions being coupled with the digit lines;
storage elements coupled with the upper source/drain regions;
wordlines extending along a second direction which crosses the first direction; the wordlines including gate regions adjacent the channel regions; and
shield lines extending along the second direction; each of the shield lines being coupled with the shield-connection-line.

11. The integrated assembly of claim 10 wherein the shield-connection-line is coupled with a reference-voltage-source.

12. The integrated assembly of claim 11 wherein the reference-voltage-source is at ground voltage.

13. The integrated assembly of claim 11 wherein the reference-voltage-source is not at ground voltage.

14. The integrated assembly of claim 10 wherein the each of the vertically-extending pillars has a first side and an opposing second side; the first side being proximate one of the wordlines, and the second being proximate one of the shield lines.

15. The integrated assembly of claim 10 wherein the shield-connection-line is a first shield-connection-line; wherein another one of the conductive lines is a second shield-connection-line; wherein the shield lines coupled with the first shield-connection-line are a first set of the shield lines; and further comprising a second set of the shield lines coupled with the second shield-connection-line.

16. The integrated assembly of claim 15 wherein the first and second shield-connection-lines are coupled to a common reference-voltage-source.

17. The integrated assembly of claim 15 wherein the first shield-connection-line is coupled to a first reference-voltage-source and the second shield-connection-line is coupled to a second reference-voltage-source which is different from the first reference-voltage-source.

18. The integrated assembly of claim 15 wherein the conductive lines are together a group of conductive lines; said group of conductive lines having a first side and a second side, with the second side being in opposing relation to the first side; and wherein one of the first and second shield lines is along the first side and the other of the first and second shield lines is along the second side.

19. The integrated assembly of claim 15 wherein the conductive lines are together a group of conductive lines; said group of conductive lines having a first edge line along one side of the group of conductive lines, and having a second edge line along a second side of the group of conductive lines, with the second side being in opposing relation to the first side; and wherein the first and second shield lines correspond to the first and second edge lines, respectively.

20. The integrated assembly of claim 15 wherein the conductive lines are together a group of conductive lines; said group of conductive lines having a first side and a second side, with the second side being in opposing relation to the first side; and wherein the first and second shield lines are both along the first side.

21. The integrated assembly of claim 10 wherein:
the vertically-extending pillars are arranged in a matrix comprising rows and columns;
the columns comprise the associated vertically-extending pillars coupled with a common digit line;
the rows comprise the associated vertically-extending pillars having channel regions operatively proximate gate regions along a common wordline;
first and second gaps alternate between the vertically-extending pillars along the columns;
two of the wordlines are within each of the first gaps; and
one of the shield lines is within each of the second gaps.

22. The integrated assembly of claim 10 wherein the storage elements are capacitors.

23. The integrated assembly of claim 10 wherein the vertically-extending pillars comprise one or more semiconductor materials.

24. The integrated assembly of claim 10 wherein said same material of the conductive lines is a metal-containing material.

25. The integrated assembly of claim 10 wherein the storage elements are comprised by memory cells of a memory array.

26. An integrated assembly, comprising:
digit lines supported by a base and extending along a first direction;
at least one shield-connection-line supported by the base and extending along the first direction;
transistor active regions over the digit lines; each of the active regions comprising a channel region between an upper source/drain region and a lower source/drain region; the lower source/drain regions being coupled with the digit lines;
capacitors coupled with the upper source/drain regions;
wordlines extending along a second direction which crosses the first direction; the wordlines including gate regions adjacent the channel regions, the upper source/drain region having an upper surface elevationally above an uppermost surface of the wordlines; and
shield lines extending along the second direction; the shield lines being above the digit lines and being coupled with one or more of said at least one shield-connection-lines.

27. The integrated assembly of claim 26 wherein the digit lines and the at least one shield-connection-line comprise a same material as one another.

28. The integrated assembly of claim 27 wherein said same material is a metal-containing material.

29. The integrated assembly of claim 26 comprising only one of the shield-connection-lines.

30. The integrated assembly of claim 26 comprising two or more of the shield-connection-lines.

31. The integrated assembly of claim 30 wherein each of the shield lines is coupled to only one of said two or more shield-connection-lines; and wherein the connections to the two or more shield-connection-lines are sequentially distributed to the different shield-connection-lines along the first direction.

32. The integrated assembly of claim 30 wherein each of the shield lines is coupled to only one of said two or more shield-connection-lines; and wherein the connections to the two or more shield-connection-lines are distributed in batches along the first direction.

33. The integrated assembly of claim 30 wherein the digit lines together are a group; wherein said group has a first side and a second side in opposing relation to the first side; and wherein one of the shield-connection-lines is along the first side of the group and is outward of the group.

34. The integrated assembly of claim 33 wherein another of the shield-connection-lines is along the second side of the group and is outward of the group.

35. The integrated assembly of claim 33 wherein another of the shield-connection-lines is along the first side of the group and is outward of the group.

\* \* \* \* \*